(12) United States Patent
Yakymyshyn et al.

(10) Patent No.: US 7,187,187 B2
(45) Date of Patent: Mar. 6, 2007

(54) SIGNAL ACQUISITION PROBING SYSTEM USING A MICRO-CAVITY LASER

(75) Inventors: Christopher P. Yakymyshyn, Seminole, FL (US); William Q. Law, Beaverton, OR (US); William A. Hagerup, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 41 days.

(21) Appl. No.: 11/077,692

(22) Filed: Mar. 10, 2005

(65) Prior Publication Data

US 2005/0200371 A1   Sep. 15, 2005

Related U.S. Application Data

(60) Provisional application No. 60/552,334, filed on Mar. 10, 2004.

(51) Int. Cl.
*G01R 31/302* (2006.01)
*G01R 31/308* (2006.01)

(52) U.S. Cl. ...................... 324/753; 324/750
(58) Field of Classification Search ................. None
See application file for complete search history.

(56) References Cited

U.S. PATENT DOCUMENTS

| 4,196,396 | A | | 4/1980 | Smith |
|---|---|---|---|---|
| 4,982,405 | A | | 1/1991 | Zayhowski |
| 5,353,262 | A | | 10/1994 | Yakymyshyn |
| 5,394,098 | A | | 2/1995 | Meyrueix |
| 5,585,735 | A | * | 12/1996 | Takahashi et al. .......... 324/753 |
| 5,590,090 | A | | 12/1996 | Duggal |
| 5,754,333 | A | | 5/1998 | Fulbert |
| 5,808,473 | A | | 9/1998 | Shinagawa |
| 5,889,798 | A | | 3/1999 | Molva |
| 6,166,845 | A | | 12/2000 | Ito |
| 6,402,549 | B1 | | 6/2002 | Ayres |
| 6,402,565 | B1 | | 6/2002 | Pooley |
| 6,629,048 | B1 | | 9/2003 | Law |
| 2005/0200362 | A1 | * | 9/2005 | Yakymyshyn et al. ...... 324/501 |

OTHER PUBLICATIONS

Y. Li et al., "Rapidly tunable millimeter-wave Optical transmitter for Lidar-Radar", Center for Microwave-Lightwave Engineering, Drexel University, Philadelphia, PA, pp. 1-23, date unavailable.
A.J.C. Vieira et al., "Nd:LiNbO3 Microchip Laser with 20 GHz Subcarrier," 1997 IEEE MTT-S Digest, pp. 229-232, month unavailable.

* cited by examiner

*Primary Examiner*—Vinh Nguyen
*Assistant Examiner*—Russell M. Kobert
(74) *Attorney, Agent, or Firm*—William K. Bucher

(57) ABSTRACT

A signal acquisition probing system uses a micro-cavity laser to acquire an electrical signal from a device under test. The micro-cavity laser has a VCSEL gain medium and an electro-optic optical resonant cavity. The micro-cavity laser is pumped by an external laser source and generates a frequency modulated optical signal derived from the device under test electrical signal creating an electro-magnetic field distribution in electro-optic material in the micro-cavity laser that overlaps the optical path of the optical signal propagating in the electro-optic material. The frequency modulated optical signal is coupled to an optical receiver which converts the frequency modulated optical signal to an electrical signal. The electrical signal is coupled to measurement test instrument for processing and displaying of the electrical signal.

13 Claims, 11 Drawing Sheets

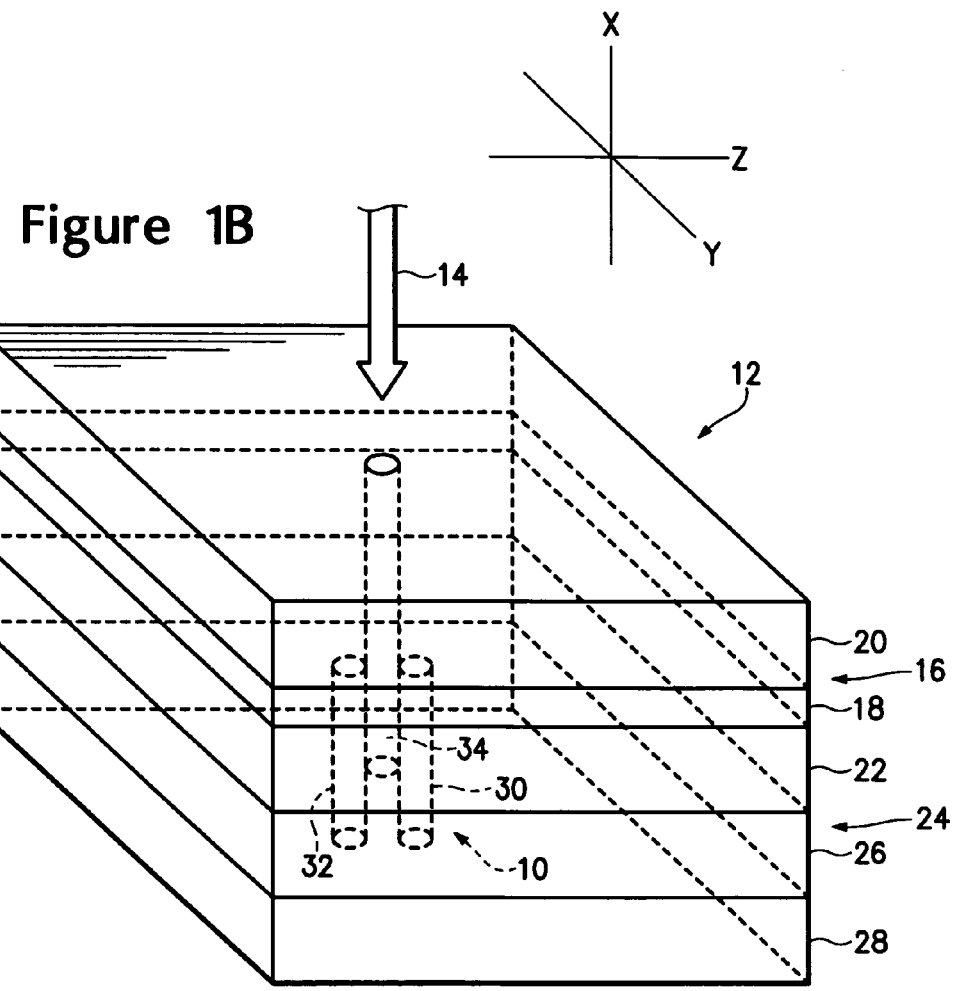

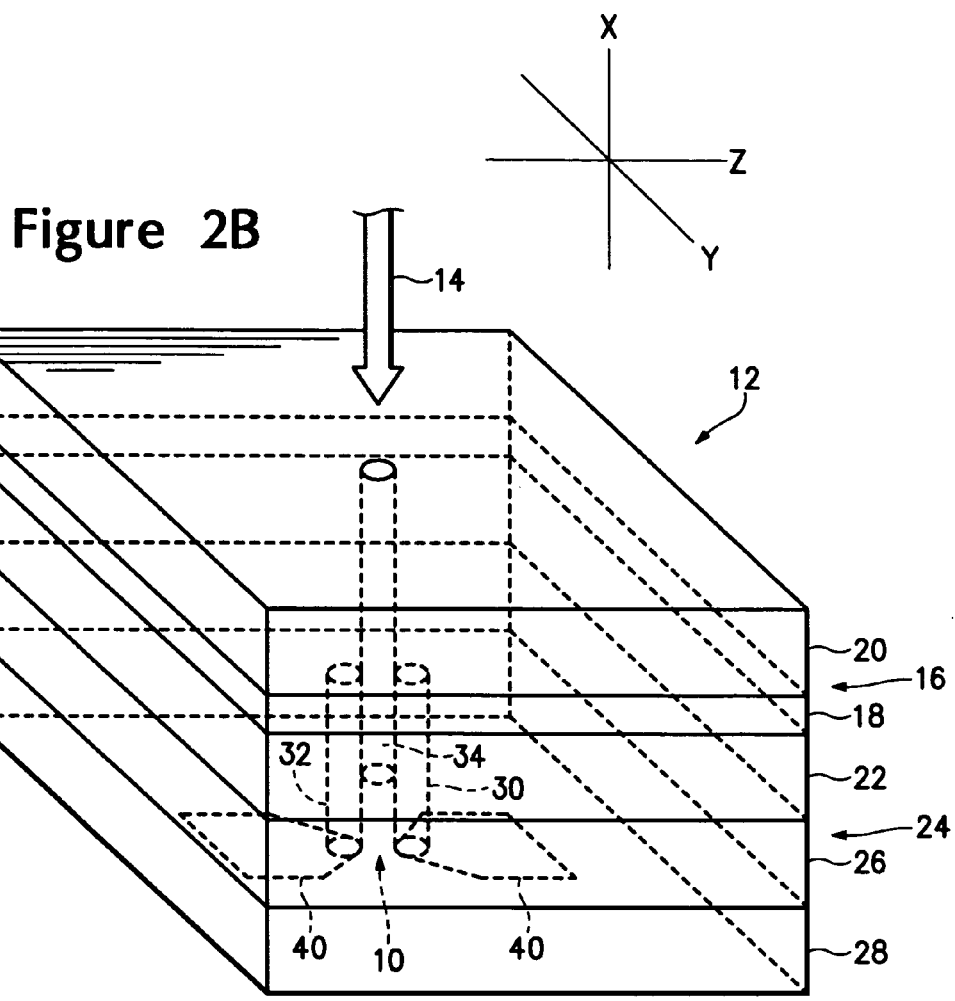

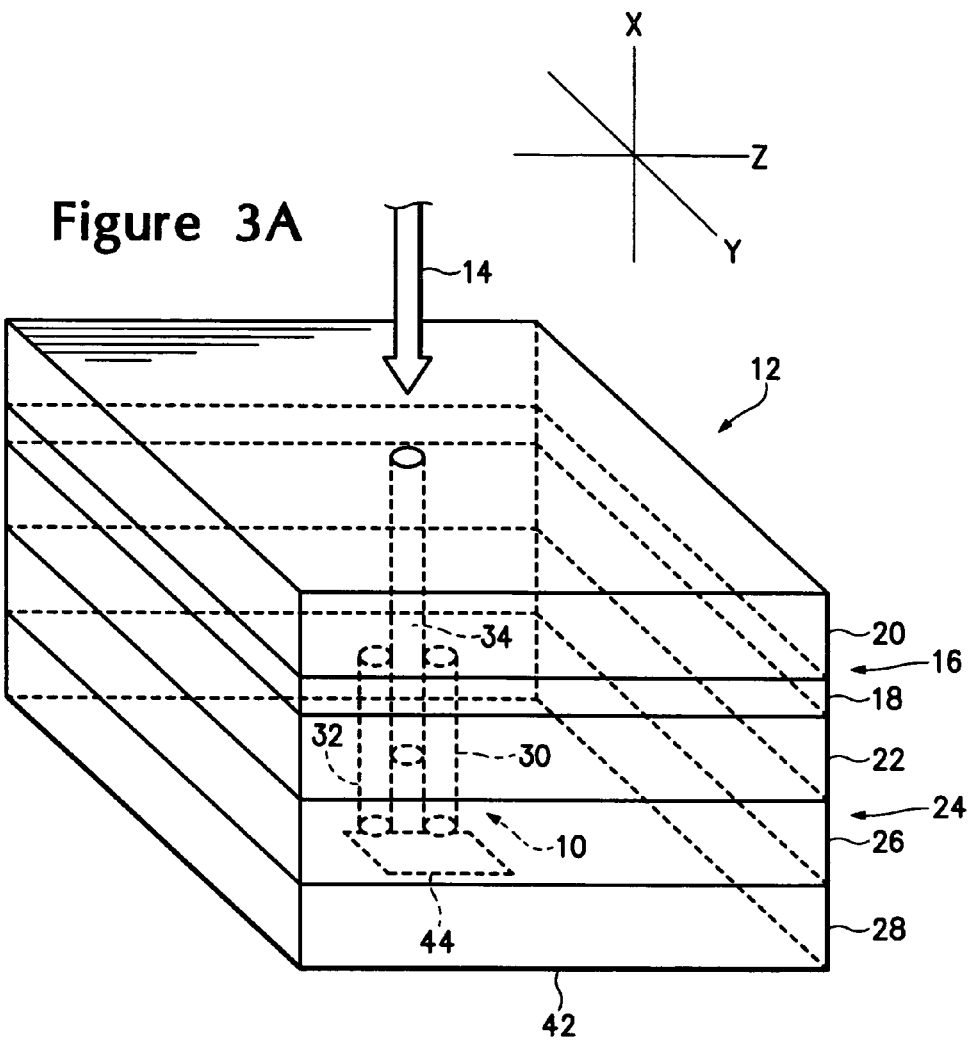

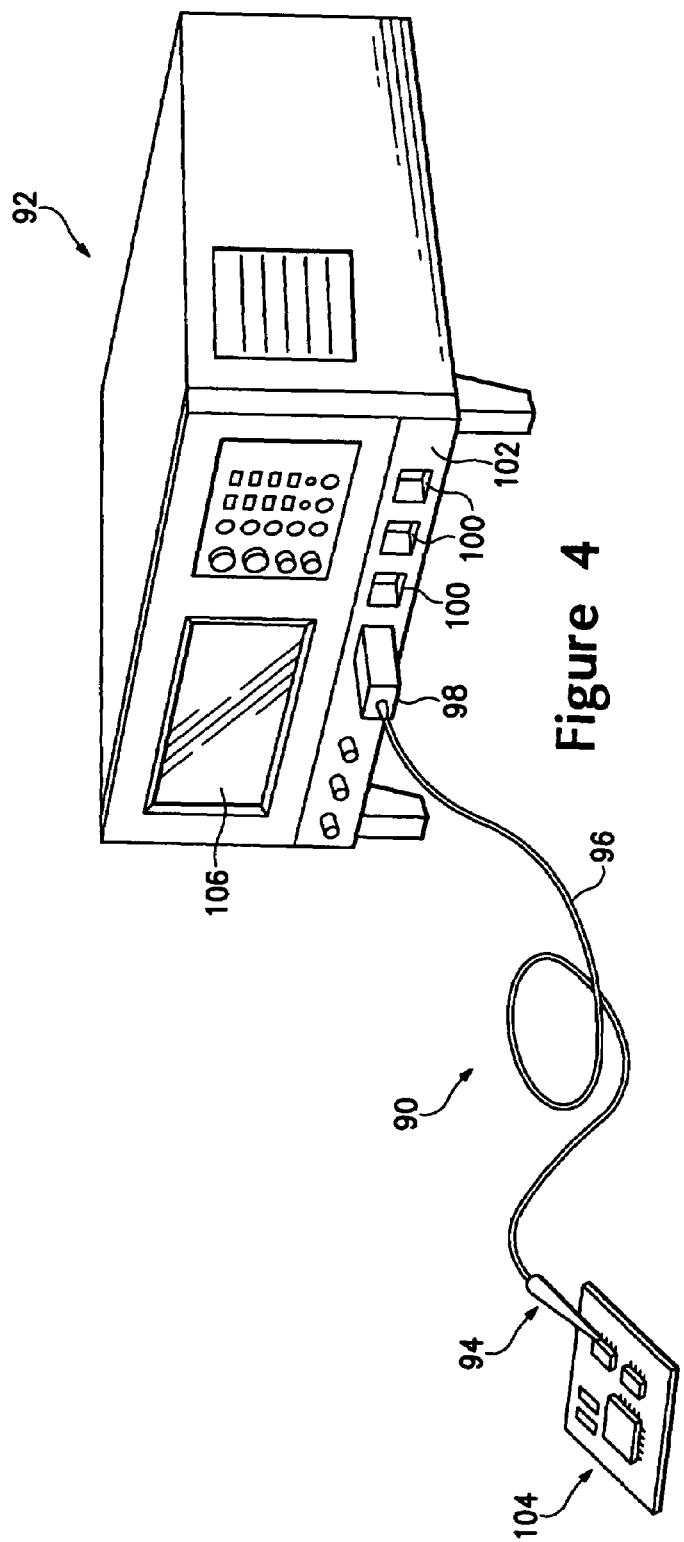

SIGNAL ACQUISITION PROBING SYSTEM USING A MICRO-CAVITY LASER

CROSS-REFERENCE TO RELATED APPLICATION

This application claims the benefit of the U.S. Provisional Application No. 60/552,334, filed Mar. 10, 2004.

BACKGROUND OF THE INVENTION

The present invention relates generally to signal acquisition probes and more particularly to signal acquisition probing systems using a micro-cavity laser.

U.S. Pat. No. 4,982,405 teaches a Q-switched micro-cavity laser having a first resonant cavity consisting of a gain medium disposed between two optically reflective mirrors. A second optical resonant cavity is formed by two partially reflective mirrors and is physically and optically coupled to the first resonant cavity. The first resonant cavity will lase when pumped by an external optical source. The reflectivity of the intermediate mirror common to the first and second cavities as seen by the gain medium of the first resonant cavity looking toward the second resonant cavity is determined by the resonant modes of the second resonant cavity. It is therefore possible to prevent or permit the gain medium to lase by adjusting the second resonant cavity such that the resonances of the second cavity causes either low reflectivity of the common mirror, which prevents lasing, or high reflectivity in the common mirror, which induces lasing.

The '405 patent teaches a number of embodiments for varying the second resonant cavity. Of particular interest to the present invention, the second resonant cavity of formed of an electro-optic material disposed between the two partially reflective mirrors with two opposing electrodes disposed adjacent to the electro-optic material. Applying an electric field across the electro-optic material changes the index of refraction of the material, which varies the reflectivity of the intermediate mirror as seem by the gain medium in the gain cavity. This results in the micro-cavity laser generating a train of optical pulses that are dependent on the applied electrical field across the electro-optic material. The '405 patent also teaches that the second resonant cavity need not affect the gain cavity so much that the lasing is turned on or off. Instead, the resonant cavity can be used to modulate the intensity of the light produced by the gain medium.

A paper titled "Rapidly Tunable Millimeter-Wave Optical Transmitter for Lidar-Radar" by Y. Li, A. J. C. Vieira, S. M. Goldwasser and P. R. Herczfeld teaches the use of two electro-optical mono-mode micro-chip laser sections formed on a single composite crystal for producing a rapidly tunable millimeter wave optical transmitter. The side-by-side micro-chip lasers are formed with a Nd:YVO$_4$ gain medium resonant cavity and a MgO:LiNbO$_3$ electro-optic resonant cavity. The micro-chip lasers are optically pumped by independent 808 nm high power laser diodes. Electrodes are deposited on opposing sides of each of the electro-optic resonant cavities. A DC voltage is applied to one of the electrodes of one of the electro-optic resonant cavities, which changes the wavelength of the optical output with respect to the other micro-chip laser. The optical output of the micro-chip lasers are heterodyned resulting a tunable beat frequency range of 45 GHz with a voltage sensitivity of 10.6 MHz/V. The transmitter was set at an 8 GHZ bias point using a phase lock loop. A 10 MHZ, 18V peak-to-peak ramp signal is applied to one of the micro-chip lasers. The signal was recovered and measured, which showed a frequency excursion of 190.8 MHz over a 50 ns time corresponding to a chirp rate of 3816 THz/sec. The reference concludes by indicating continuing efforts to increase the voltage sensitivity by reducing the crystal thickness and improving the electrical contacts.

The strength of the electric field distribution within the electro-optic material is a function of the distance between the opposing electrodes and the amplitude of the applied electrical signal. The strength of the electric field is the inverse of the distance separation of the electrodes. As the distance between the electrodes decreases, the strength of the electric field between them increases. As the distance decreases, the magnitude of the electrical signal can decrease to generate the same amount of change in the index of refraction.

Currently, the minimum overall dimensions of the electro-optic material used in optical devices and cavities is limited by the practical size at which the material can be handled resulting in electrodes that are positioned at a substantial distance from the optical path of the optical signal. This results in optical devices having low sensitivity to the applied electrical signal.

There is an increasing need in the electronics industry for measurement test equipment, such as oscilloscopes, logic analyzers and the like, to measure electrical signals in the gigahertz range. Correspondingly, there is a need for measurement instrument signal acquisition probes that have the signal bandwidth to acquire such high frequency signals. Generally gigahertz bandwidth signal acquisition probes have active circuitry in the probing head of the probe that receives the electrical signal via a metal probing tip extending from the end of the probing head. Extensive design work is required to minimize probe tip inductance and capacitance that affect the overall bandwidth of the probe. In addition, the dielectric constant of the probe head material also needs to be minimized for gigahertz differential signal acquisition probes. A further complication for gigahertz signal acquisition probe designs is the signal loss through the coaxial cable that couples the probing head to the measurement instrument.

U.S. Pat. No. 5,808,473, titled "Electric Signal Measurement Apparatus Using Electro-Optic Sampling by One Point Contact" describes an electro-optic sampling high-impedance probe exploiting the Pockels effect to rotate the polarization state of a light beam. The Pockels effect changes the birefringence of an electro-optic crystal by an amount that is proportional to an electric field inside the crystal. With the proper application of electrodes to the crystal surface, and their connection to conductive probing tips, the polarization rotation can be made to respond to a voltage on a device under test (DUT). The electro-optic sampling high-impedance probe receives polarization maintained laser pulses via a single mode polarization maintaining fiber. The laser pulses are coupled through bulk optic devices onto an electro-optic element having a reflective film on one end. A metal pin in the end of the signal probe head abuts the reflective film on the electro-optic element. The metal pin couples an electrical signal from a device under test to the electro-optic element which alters the birefringence of the electro-optic element in response to the electrical field of the signal causing the polarization state of the laser beam to change. The laser beam having the changed polarization state is reflected by the reflecting film and coupled through polarization beam splitters which convert the S and P polarized beams into an intensity change. The S and P polarized beams are coupled through respective condensing lenses onto respective slow germanium photodetectors that convert the optical beams into electrical signals. The electrical signals are coupled to a measurement instrument and detected by a differential amplifier.

U.S. Pat. No. 6,166,845 describes a modification to the above described electro-optic sampling high-impedance probe. Instead of coupling laser pulses via a single mode polarization maintaining fiber to the probe, a laser diode is incorporated into the probe itself. The laser diode generates a pulsed laser output in response to an input pulse chain from the measurement instrument. The probe contains the bulk optic devices, electro-optic element and photodetectors as previously described. The metal pin couples the electrical signal from a device under test to the electro-optic element which alters the birefringence of the electro-optic element in response to the electrical field of the signal causing the polarization state of the laser beam to change. The S and P polarized beams are coupled through the beam splitters and the condensing lenses onto the photodetectors. The photodetectors convert the intensity beams into electrical signals and couple the electrical signals to the measurement instrument.

A drawback to this type of probe is the size of the probing head due to the number of optical elements contained therein. Further, voltage and signal lines are required to couple the voltage power to the laser diode and photodetectors, couple the drive signal to the laser diode and to couple the outputs of the photodetectors to the measurement instrument.

U.S. Pat. No. 5,353,262 describes an ultrasound optical transducer that generates an optical signal the frequency of which varies in correspondence with acoustic energy incident on the transducer. The transducer includes a housing in which is disposed a signal laser. The signal laser is preferably a microchip laser, microcavity laser or the like. The signal laser has an optical cavity disposed between first and second reflectors and in which a lazing medium (also known as a gain crystal) is disposed. The reflectors are disposed on opposing plane-parallel surfaces of the lasing medium. An optical source injects an optical signal at a first frequency into the signal laser, which generates a second output signal at a second frequency. Acoustic energy impinging on the transducer causes the index of refraction of the optical cavity to change which in turn, causes the frequency of the signal laser to change. The frequency modulated optical signal from the signal laser is coupled to signal processing assembly that generates an output signal corresponding to the amplitude of the incident acoustic energy for use in imaging and analysis. An alternative embodiment is described where a piezoelectric device is positioned on the transducer for converting the acoustic energy into an electrical signal. The electrical signal is applied to electrodes on the signal laser. The electrical signal causes a change in the index of refraction of the optical cavity as a function of the acoustic energy applied to the piezoelectric device.

U.S. Pat. No. 5,590,090 describes an ultrasound optical transducer that generates an optical signal the frequency of which varies in correspondence with acoustic energy incident on the transducer. The transducer incorporates an electrically pumped vertical cavity surface emitting laser (VCSEL) array. The cavity length of each laser or pixel of the array is modulated by the acoustic field at the point where the acoustic field contacts the pixels. The resulting laser output is frequency modulated by the acoustic field. The modulation is converted into amplitude modulation at the detector head and then wither detected with a charged couple device (CCD) array with the information being electrically communicated to a signal processing assembly or sent directly by optical fiber to the signal processing assembly.

What is needed is a signal acquisition probing system using a micro-cavity laser. The micro-cavity laser used in the signal acquisition probing system needs to provide greater sensitivity to an applied electrical signal to allow measurement small voltage signals.

SUMMARY OF THE INVENTION

Accordingly, the present invention is a signal acquisition probing system for sensing an electrical signal from a device under test. The signal acquisition probing system has an optical transmitter generating a coherent optical signal that is used to optically pump a micro-cavity laser. The micro-cavity has an optical gain cavity formed by a vertical cavity surface emitting laser having an optical gain medium disposed between opposing optically reflective materials. The optical gain cavity generates an optical output in response to the optical pump signal. The optical signal from the optical gain cavity is provided to an optical resonant cavity having electro-optic material disposed between opposing optically reflective materials with one of the optically reflective materials being a common reflective material with one of the optical reflective materials of the optical gain cavity. The optical resonant cavity has first and second electrically conductive electrodes receiving the electrical signal from the device under test. The electrically conductive electrodes are formed in at least a portion of the electro-optic material generally parallel to the received optical signal propagating within the electro-optic material. An optical transmission system optically couples the coherent optical signal from the optical transmitter to the micro-cavity laser and coupled a frequency modulated optical signal generated by the micro-cavity laser to an optical receiver. The frequency modulated optical signal represents the electrical signal from the device under test derived from the device under test electrical signal creating an electromagnetic field distribution in the electro-optic material that overlaps the optical path of the optical signal propagating in the electro-optic material, which varies the index of refraction of the electro-optic material in the optical path. The optical receiver generates an output electrical signal from the frequency modulated optical signal representative of the electrical signal on the device under test.

The electro-optic material in the optical resonant cavity has X, Y, and Z optical axes and corresponding crystal faces orthogonal to the respective X, Y, and Z optical axes. The optically reflective materials may be disposed on the opposing crystal faces orthogonal to one of the X, Y, and Z optical axis. The received optical signal from the optical gain medium propagates generally parallel to at least one of the optical axes in the electro-optic material with the first and second electrically conductive electrodes generally parallel to same optical axis. Electrically conductive contacts may be formed on an exterior surface of the micro-cavity laser that are electrically coupled to one of the electrically conductive electrodes. Additionally, a resistor may be coupled between the electrically conductive electrodes or between the electrically conductive contacts. Further, individual resistors may be electrically coupled to each electrically conductive electrode or the electrically conductive contacts coupled to the electrodes. An acoustic damping material covers a substantial portion of the micro-cavity laser to minimize acoustic modes in the micro-cavity laser.

The optical receiver is implemented with a Fabry-Perot etalon optically coupled to receive the frequency modulated optical signal from the micro-cavity laser via an optical beam splitter of the optical transmission system. The Fabry-Perot etalon generates a intensity modulated optical signal representative of the electrical signal from the device under test which is optically coupled to a first optical-to-electrical converter. The first optical-to-electrical converter generates an electrical signal representative of the electrical signal under test. A portion of the electrical signal from the first optical-to-electrical converter is coupled to an amplifier which generates an amplified electrical signal representative of the electrical signal from the device under test. A signal averager is coupled to receive the other portion of the electrical signal from the first optical-to-electrical converter and generates an electrical signal representative of the average output of the optical-to-electrical converter. A second optical-to-electrical converter is coupled to the beamsplitter and receives a reflected intensity modulated optical signal from the Fabry-Perot etalon and generating an electrical signal. The electrical signals from the signal averager and the second optical-to electrical converter are input to a comparator which generates an electrical signal for tuning the Fabry-Perot etalon to lock the Fabry-Perot etalon passband to the average value of the micro-cavity laser frequency.

The objects, advantages and novel features of the present invention are apparent from the following detailed description when read in conjunction with appended claims and attached drawings.

BRIEF DESCRIPTION OF THE DRAWINGS

FIGS. 1A–1B illustrate alternative electrode configurations of the electrode structure for micro-cavity laser used in a signal acquisition probing system according to the present invention.

FIGS. 2A–2B illustrate contact configurations for the electrode structure in the micro-cavity laser used in a signal acquisition probing system according to the present invention.

FIGS. 3A–3B illustrate further embodiments of the micro-cavity laser in the signal acquisition probing system according to the present invention.

FIG. 4 illustrates the signal acquisition probing system according to the present invention.

DETAILED DESCRIPTION OF THE PREFERRED EMBODIMENT

Figure 1A:
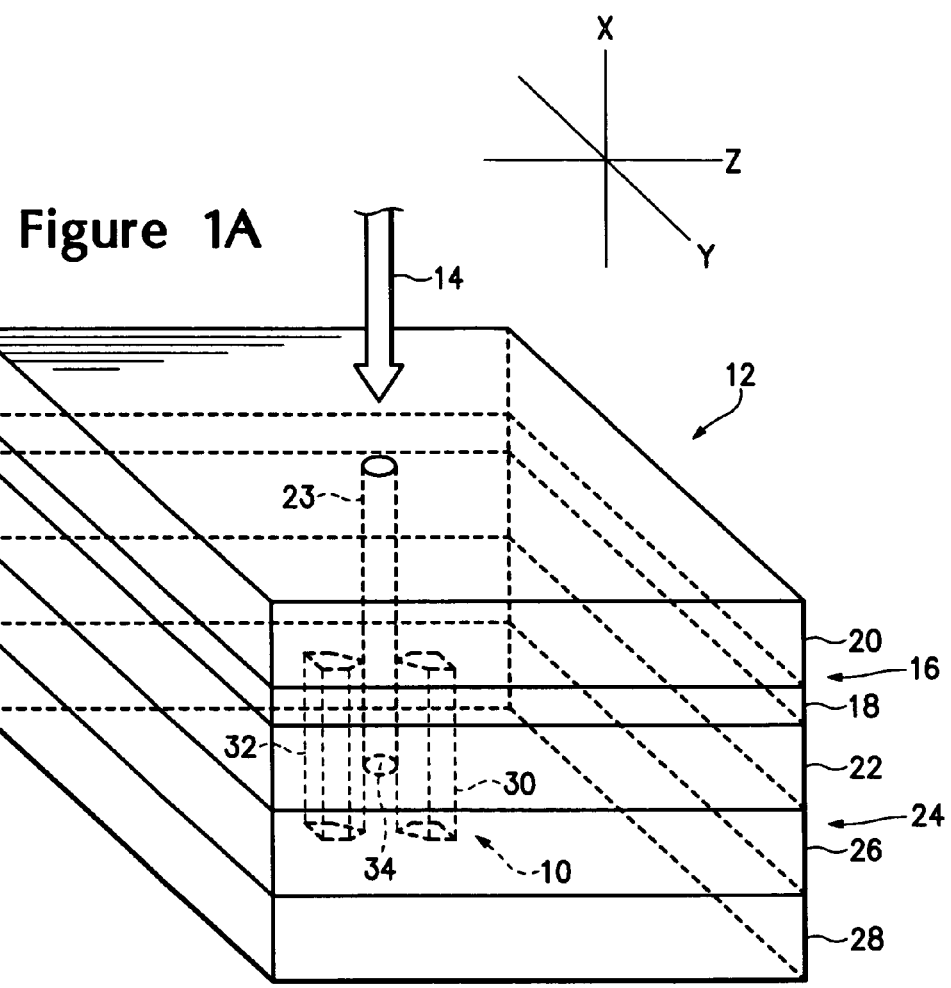

Referring to FIGS. 1A and 1B, there are shown various electrodes structures 10 usable in a micro-cavity laser 12 receiving an optical signal 14. The micro-cavity laser 12 has an optical gain cavity 16 implemented as a vertical cavity surface emitting laser (VCSEL). The VCSEL has an active gain medium 18 disposed between two optically reflective materials 20 and 22. The active gain medium 18 is of the group of inorganic crystals, such as GaAs, AlGa As, InGaAsP and the like, that generates a coherent, polarized optical output 23 when either pumped by an coherent optical input, such as the optical signal 14 or by a forward bias voltage on the VCSEL. An optical resonant cavity 24 is coupled to the optical gain cavity 16 and has an electro-optic material 26 disposed between opposing optical reflective materials 22 and 28 where the optically reflective material 22 is common to the two cavities. The optically reflective materials 20, 22 and 28 are preferably ceramic mirrors formed from layers of zirconium dioxide, silicon dioxide and silicon nitride. It is important in certain applications that the optically reflective materials be non-metallic to reduce capacitive and inductive effects. The reflectivity of the optically reflective materials 20, 22 and 28 vary depending on the proposed application for the micro-cavity laser 12. The optically reflective materials 20, 22 and 28 may be partially reflective or totally reflective to particular wavelengths of light. For example, optically reflective material 20 may have low reflectivity for the pump laser light (e.g. 5% reflectivity) of the optical signal 14 and high reflectivity (e.g. 99.5% reflectivity) for the laser light 23 generated by the gain medium 18. The optical reflective material 22 may have high reflectivity for the pump laser light (e.g. greater than 90% reflectivity) and medium reflectivity for the gain medium laser light 23 (e.g 50% reflectivity). The optically reflective material 28 generally has a high reflectivity (e.g. 95 to 99.5% reflectivity) depending on the output direction of the laser light 23 from the micro-cavity laser 12. The reflectivity of the optical reflective medium 28 is a high as possible for generating an output along the same path as the pump laser light. The reflectivity of the optically reflective material 28 is as high as 99.5% for generating an output opposite that of the pump laser light. The gain medium 18 will produce laser light of a frequency determined by the modes of the cavity. Applying an electromagnetic field across the electro-optic material 26 changes the index of refraction of the material, causing the reflectivity of the optically reflective material 22 to vary as seen by the gain medium 18 in the optical gain cavity 16. The application of the varying electromagnetic field results in the production of a series of output pulses or frequency modulation of the laser light 23 of the gain medium 18 as the reflectivity of the common optically reflective material 22 seen by the gain medium 18 changes due to resonances in the optical resonant cavity 24.

The electro-optical material 26 in the optical resonant cavity 24 may be formed from inorganic and organic materials, such as Rubidium Titanyl Arsenate (RTA), Rubidium Titanyl Phosphate (RTP), Zinc Telluride (ZnTe), DimethylAmino-methyl Stilbazolium Tosylate (DAST), Potassium Titanyl Phosphate (KTP), or other electro-optic materials, such as electro-optic polymers, all having the property of a changing index of refraction in response to an applied electromagnetic field. The inorganic and organic materials have crystallographic axes defining the crystallographic structure of the electro-optic material 26. Crystals systems are cubic, tetragonal, orthorhombic, monoclinic and triclinic. The crystallographic axes for the cubic, tetragonal and the orthorhombic systems are mutually perpendicular to each other. The monoclinic and triclinic crystal systems have one or more of the crystallographic axes at oblique angles to each other. The hexagonal crystal system has two crystallographic axes falling on the same plane at 120° to each other and a third axis orthogonal to the other two. The inorganic and organic materials further have X, Y and Z optical axes which may or may not coincide with the crystallographic axes.

The optical resonant cavity 24 will be described below in relation to inorganic RTA electro-optic material having an orthorhombic crystalline structure and optical axes coincident with the crystallographic axes. It is understood that the optical resonant cavity 24 is applicable to the other crystal structures and organic polymers having one or more optical axes that are responsive to an electro-magnetic field for changing the index of refraction of the electro-optic material. Further, the present invention will be described in relation to specific optical axes of the RTA electro-optic material 26 and a specific orientation of a propagating laser light 23 and orientations of the electro-magnetic field within the RTA electro-optic material 26. In the preferred embodiment, the RTA electro-optic material 26 is an X-cut crystal face where the cleaved and polished surfaces of the crystal are perpendicular to the optical X-axis. Alternatively, the RTA electro-optic material 26 may be a Y-cut crystal face. The X-cut crystal is preferred over the Y-cut crystal for minimizing distortions from the acoustic modes generated within the electro-optic material 26. It should be noted that the electro-optic properties of other crystallographic structures may result in the preferred cut crystal face being orthogonal to the optical Z-axis producing a Z-cut crystal face.

The optical signal 14 provided to the micro-cavity laser 12 is preferably provided by a coherent optical source, such as a laser diode or the like, generating an optical signal having a wavelength in the range of 600 to 1500 nm. The optical signal 14 has an optical path diameter ranging from approximately 15 to 150 microns. Other optical path diameters may be used with the electrode structure of the present invention.

The change in the index of refraction of the electro-optic material 26 in the presence of an electro-magnetic field is a function of the orientation of the laser light 23 propagating in the electro-optic material 26 and the relationship of the polarization state of the laser light 23 and the electrode structures 10 to the optical axes of the electro-optic material 26. For example, RTA electro-optic material exhibits the highest index of refraction and largest sensitivity response to an electro-magnetic signal when the polarization state of the laser light 23 and the electromagnetic field are parallel with the optical Z-axis of the RTA material. However, the RTA electro-optic material exhibits the highest piezoelectric response along the Z-axis, and the lowest piezoelectric response along the X-axis, when the electromagnetic field is parallel to the optical Z-axis. The piezoelectric effect causes a change in the refractive index of the crystal, but also physically alters the length of the material (or strain) along the three principle crystal axes. To minimize the effect of the piezoelectric strain on the modulated signal, it is desirable to ensure that the smallest change in crystal length occurs along the crystal axis that is perpendicular to the two cavity mirrors attached to the crystal. Therefore, in the preferred embodiment, the polarization state of the laser light 23 and the electro-magnetic field are parallel with the optical Z-axis, and the optical beam propagates through the crystal parallel to the X-axis to minimize the effects of the acoustic modes in the RTA electro-optic material on the resulting optical modulation.

The electrode structures 10 in FIGS. 1A and 1B are formed in the optical resonant cavity using well known semiconductor manufacturing processes. The electrode structure 10 has electrically conductive electrodes 30 and 32 formed in the optically reflective material 28 and the RTA electro-optic material 26 that are generally parallel to the optical path 34 of the laser light 23 from the gain medium 18 propagating through the electro-optic material 26. The RTA electro-optic material 26 has mutually perpendicular optical axes X, Y and Z that coincide with the crystallographic axes of the RTA material. The electrically conductive electrodes 30 and 32 are disposed on the opposite sides of the optical path 34 of the propagating laser light 23 and are oriented parallel to the optical X-axis of the electro-optic material 26. The electrically conductive electrodes 30 and 32 are preferably formed as close as possible to the propagating laser light 23 with the electrode separation, for example, being in the range of 45 to 120 microns. In some applications, the electrically conductive electrodes 30 and 32 may extend into the optical path 34 of the propagating laser signal. The electrically conductive electrodes 30 and 32 in FIG. 1A have a polygonal sectional shape with an apex directed toward the optical path 34 of the propagating laser signal 23. The apexes of the polygonal shapes concentrates the electro-magnetic field across the optical path 34. In FIG. 1B, the electrically conductive electrodes 30 and 32 are circular in form and have the same orientation with the optical path as in FIG. 1A.

Figure 2A:
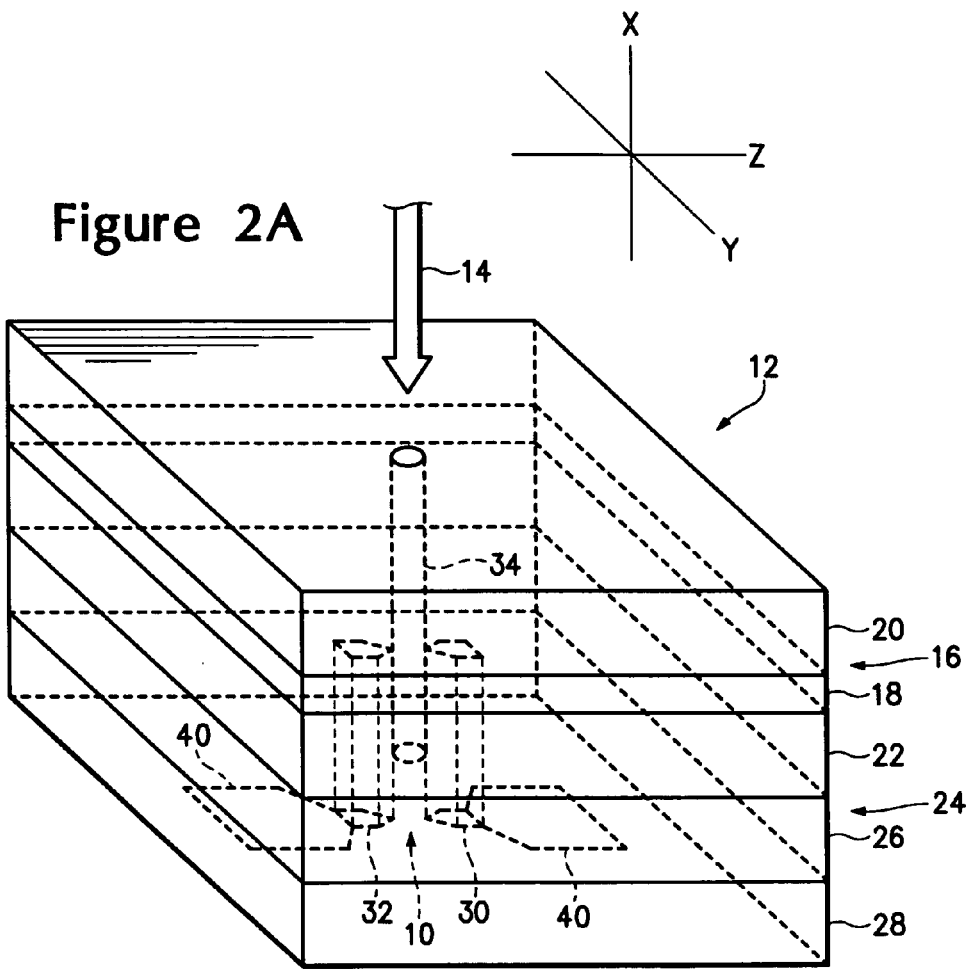

FIGS. 2A and 2B illustrates alternative electrically conductive contact 40 configurations in the electrode structure 10 of the present invention. The electrically conductive contacts 40 may be formed using well know deposition techniques, such as thin and thick film processes. The electrically conductive contacts 40 are preferably formed of gold deposited over a layer of chromium. The electrically conductive contacts 40 are formed on the same exterior surface 42 of the optically reflective material 28 with each contact 40 in electrical contact with the electrically conductive electrodes 30 and 32. The electrically conductive contacts 40 are preferably a polygonal shape with an apex electrically coupled to the respective electrically conductive electrodes 30 and 32. In the preferred embodiment, the separation between the electrically conductive contacts 40 is in the range of 15 to 100 microns with the electrically conductive electrodes 30 and 32 set slightly back from the apexes of the contacts 40.

Figure 3B:
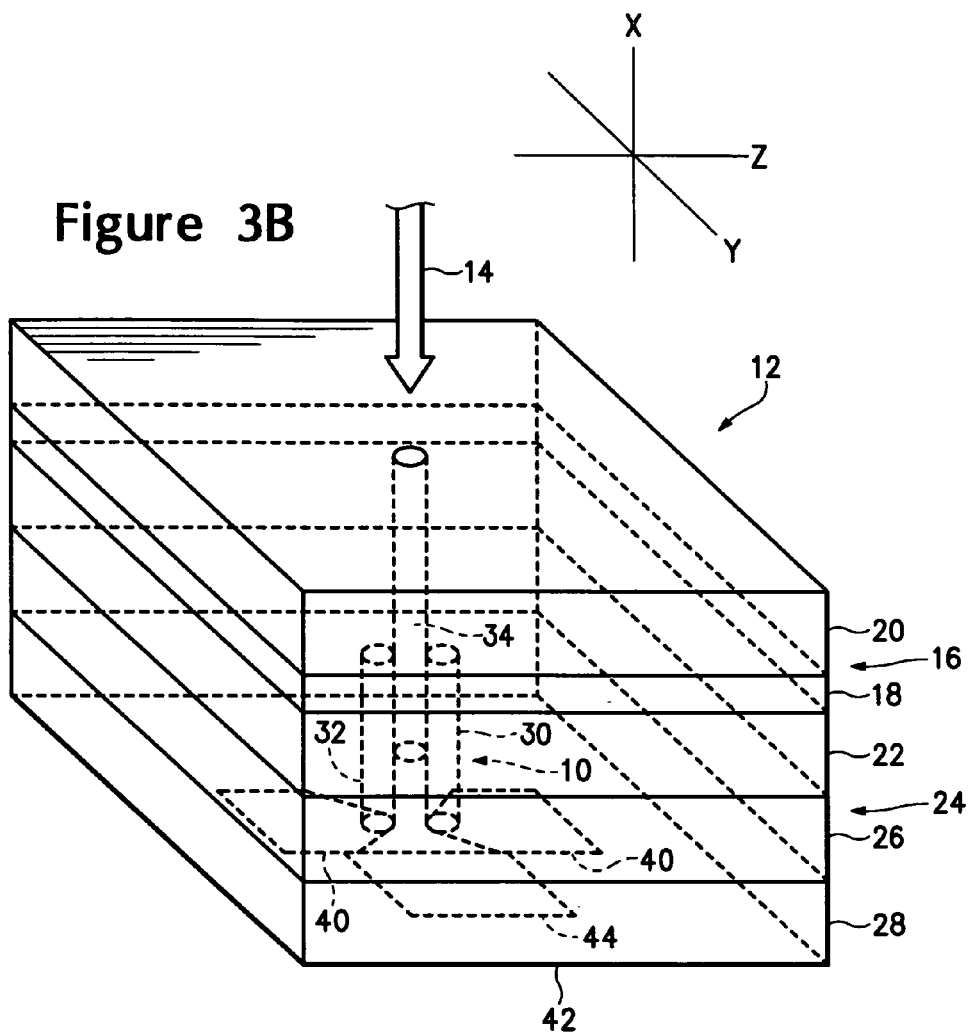

FIGS. 3A and 3B illustrate further embodiments of the micro-cavity laser 12 of the present invention. The electrode structure 10 described has an high input impedance. In certain applications it may be preferable to match the impedance of the electrode structure 10 to the impedance of the device providing the electromagnetic energy to the electrode structure 10. In FIG. 3A, an optional termination resistor 44 is shown formed on exterior surface 42 of the micro-cavity laser 12 that is perpendicular to the electrically conductive electrodes 30 and 32. The termination resistor 44 is connected between the electrically conductive electrodes 30 and 32 of the optical resonant cavity 24. The termination resistor 44 may be formed using well known processing techniques, such as thin or thick film processing. The resistance of the termination resistor 44 is set to match the impedance of the electrical device driving the optical resonant cavity 24. In FIG. 3B, the optional termination resistor 44 is shown connected between the electrically conductive contacts 40 on the exterior surface 42 of the optically reflective material 28.

Referring to FIG. 4, there is illustrated a signal acquisition probing system 90 coupled to a measurement instrument 92, such as real-time or sampling oscilloscopes, logic analyzer, vector network analyzer, or the like. The signal acquisition probing system 90 has a probing head 94 containing the micro-cavity laser 12 and an optical transmission system 96 extending from the probing head 94 to a probe interconnect housing 98. The probe interconnect housing 98 contains signal acquisition probing circuitry needed to provide an optical signal to the probing head 94 and convert the returning frequency modulated optical signal to an electrical signal. The probe interconnect housing 98 is removably connected to one of several interconnect receptacles 100 on the front panel 102 of the measurement instrument 92. The probe interconnect housing 98 and interconnect receptacles 100 are preferably TekConnect® interface devices such as described in U.S. Pat. No. 6,402,565 and incorporated herein in its entirety by reference. The TekConnect® interface has connections for coupling a wide bandwidth signal to measurement instrument, providing electrical power from the measurement instrument 92 to the probe interconnect housing 98 and communication signals between the measurement instrument 92 to the probe interconnect housing 98 as described in U.S. Pat. No. 6,629,048 and incorporated herein in its entirety by reference. The electrical signal representing the measured signal from the device under test 104 is coupled to acquisition circuitry within the measurement instrument 92 that converts the electrical signal into digital data values and stores the data values in memory. Processing circuitry operating under program control processes the digital data values to produce display data that is displayed on a display device 106, such as a liquid crystal display, cathode ray tube or the like. Alternately, the measurement instrument 92 may include the signal acquisition probing circuitry. The probe interconnect housing 98 would then include one or more optical connectors for coupling the optical signal to the probing head 94 and the return modulated optical signal to the measurement instrument 92.

Figure 5:
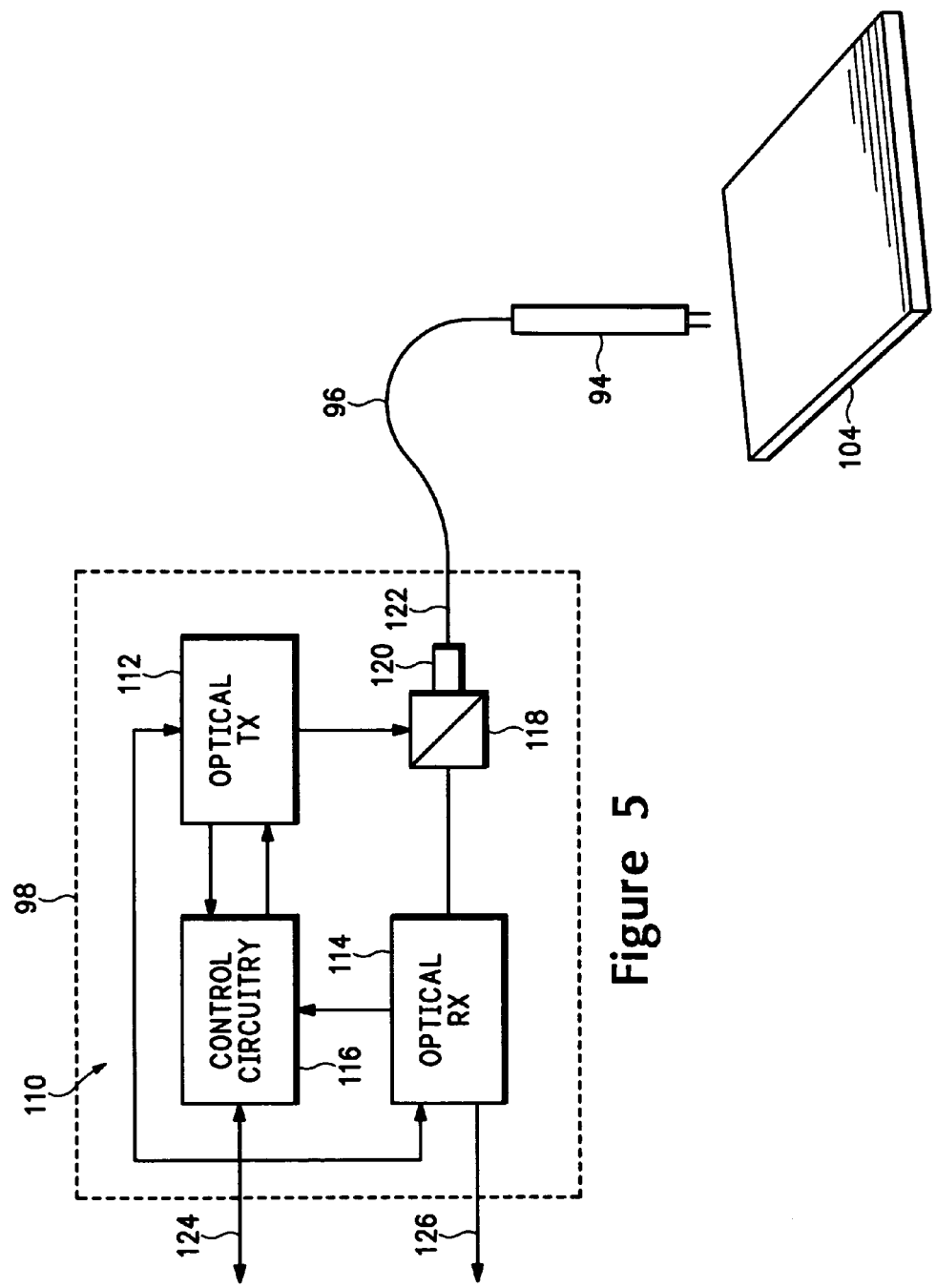
FIG. 5 general block diagram of the circuitry in the signal acquisition probing system according to the present invention.

FIG. 5 is a general block diagram of the signal acquisition probing circuitry 110 disposed in the probe interconnect housing 98 for a probing head 94 having a micro-cavity laser functioning as a voltage signal sensor. The signal acquisition probing circuitry 110 includes an optical transmitter 112, optical receiver 114 and control circuitry 116 for the optical transmitter 112 and receiver 114. The optical output from the optical transmitter 112 and the optical input to the optical receiver 114 are coupled through an dichroic optical beam splitter 118 in the optical transmission system 96. A collimating lens 120 focuses the optical signal from the beam splitter 118 into a multimode optical fiber 122. The multimode optical fiber 122 couples the optical output of the optical transmitter to the micro-cavity laser in the probing head 94 and couples the frequency modulated optical signal from the micro-cavity laser to the beam splitter 118. Data/control and voltage power lines 124 couple the signal acquisition probing circuitry in the probe interconnect housing 98 to the measurement instrument 92. A high speed coaxial interconnect 126 couples the electrical signal from the optical receiver 114 to the measurement instrument 92.

Figure 6:
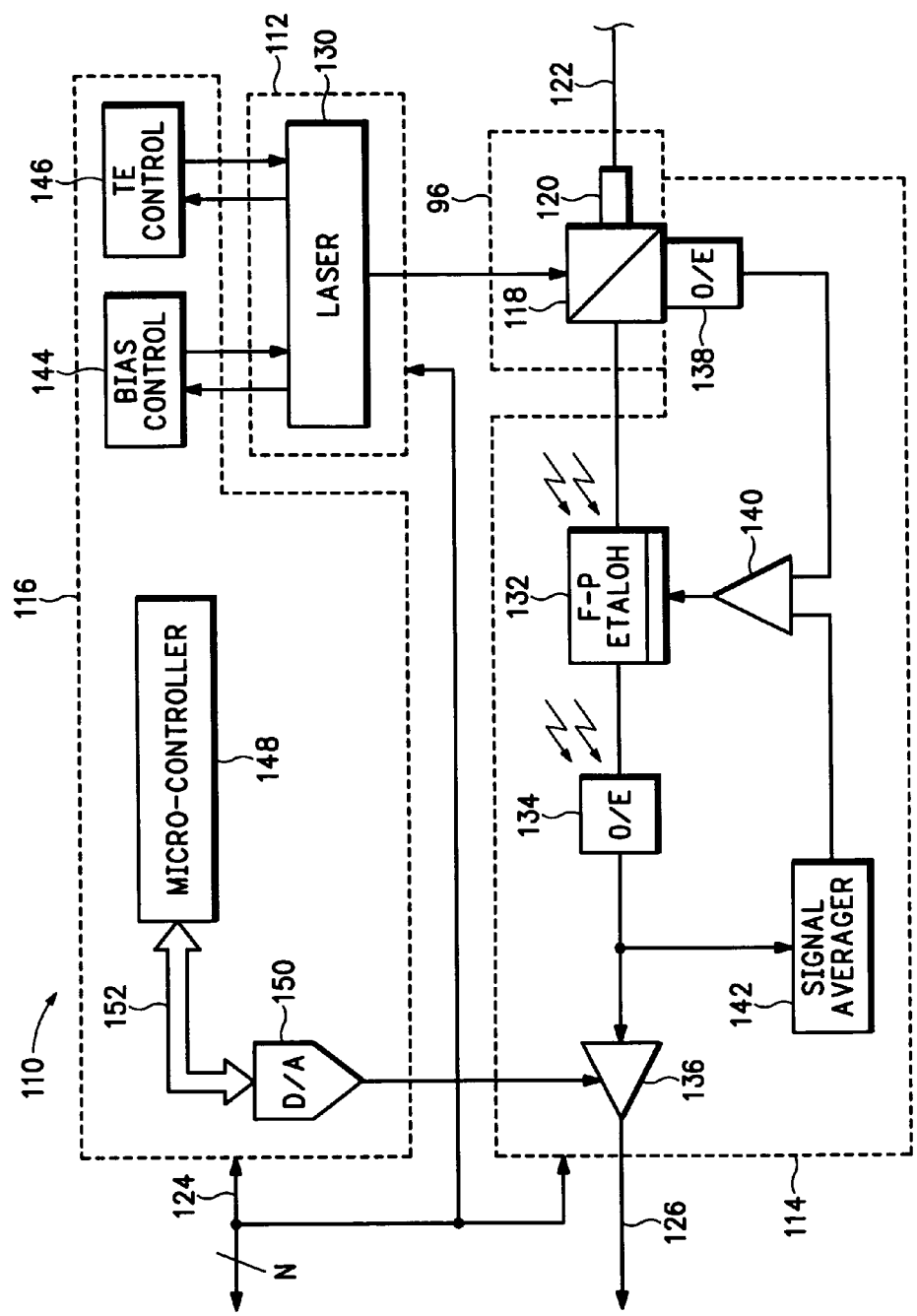
FIG. 6 illustrates more detailed block diagram of the circuitry in the signal acquisition probing system according to the present invention.

FIG. 6 is a more detailed block diagram of the signal acquisition probing circuitry 110 in the probe interconnect housing 98. The optical transmitter 112 is preferably a laser diode 130 generating an optical output having a wavelength in the range of 600 to 1500 nm. The laser diode 130 includes a thermoelectric (TE) cooler and thermistor for controlling the wavelength of the laser output and a photodetector for generating an electrical output representative of the magnitude of the laser output. The optical receiver 114 has a Fabry-Perot etalon 132 acting as a slope filter receiving the frequency modulated optical output from the beam splitter 118. The Fabry-Perot etalon 132 converts the frequency modulate optical signal into an intensity modulated optical signal, which is coupled to an optical-to-electrical converter (O/E) 134, such as a PIN or avalanche photodiode. The O/E converter 134 converts the intensity modulated optical signal an amplitude modulated electrical signal representative of the signal being measured on the device under test 104. The portion of the electrical signal from the O/E converter 134 is amplified by amplifier circuitry 136 and coupled via the coaxial interconnect 126 to the measurement instrument 92. A portion of the intensity modulated optical signal from the Fabry-Perot etalon 132 is reflected back toward the beam splitter 118 with a portion of the reflected optical signal being coupled to an O/E slow detector 138, such as a PIN or avalanche photodiode. The O/E slow detector 138 converts the reflected intensity modulated optical signal to an electrical signal, which is coupled one input of a comparator circuit 140. The other input of the comparator 140 is coupled to receive an electrical signal from a signal averager 142. The signal averager receives the other portion of the electrical signal from the O/E converter 134 and generates an electrical signal representing the average output of the O/E converter 134, which is the total return power from the micro-cavity laser 12. The comparator 140 compares output of the Fabry-Perot etalon 132 with the average output of the O/E converter 134 to generate an output signal that is used to tune the Fabry-Perot etalon 132 to maintain lock between the average value of the micro-cavity laser's 12 frequency and the Fabry-Perot etalon's passband. The Fabry-Perot etalon 132 may be mechanically, electrically or thermally tuned.

The control circuitry 116 includes bias and thermoelectric (TE) control circuitry 144 and 146 for maintaining the laser output at a constant level and at an optimum wavelength. The bias control circuitry 144 provides a feedback loop to maintain the optical output of the laser 130 at a constant level. The laser 130 includes a photodetector who current output is coupled to the inverting input of a positive gain drive amplifier. The non-inverting input of the drive amplifier is coupled to a reference voltage. As the output of the photodetector increases and decreases with changes in the output power of the laser 130, the signal applied to the inverting input of the drive amplifier varies the output of the drive amplifier. The drive amplifier varies the bias on the laser 130 to maintain the laser output at a constant level.

The TE control circuitry 146 provides a feedback loop to maintain the optical output of the laser 130 at a predetermined wavelength. The laser 130 package includes a thermo-electric cooler and a thermistor. The output of the thermistor varies in response to temperature changes of the laser 130. The thermistor output is coupled to inverting input of a TE cooler drive amplifier. The non-inverting input of the drive amplifier is coupled to a reference source. The TE control circuitry 146 is designed to produce the equal voltages on the inverting and non-inverting inputs of the TE cooler drive amplifier when the laser 130 generates the optimum output laser wavelength. Changes in the output of the thermistor causes the voltage to the inverting input of the TE drive amplifier 161 to increase or decrease causing the output voltage of the TE drive amplifier to change. The output of the TE drive amplifier is applied to the TE cooler in the laser 130 which causes the wavelength of the laser 130 to increase or decrease accordingly.

The control circuitry 110 also includes a micro-controller 148 that communicates with the measurement instrument 92 via data/control and voltage lines 124. The data/control and voltage lines 124 also provides electrical power to the optical transmitter and receiver and control circuitry 112, 114, 116. The micro-controller 148 is shown coupled a digital-to-analog converter (D/A) 150 via the data and control bus 152 for controlling the gain of the amplifier circuitry 136. Additional electronically controlled circuitry, such as variable attenuators, gain cells and the like, may be incorporated into the output signal path of the optical receiver 114.

Figure 7:
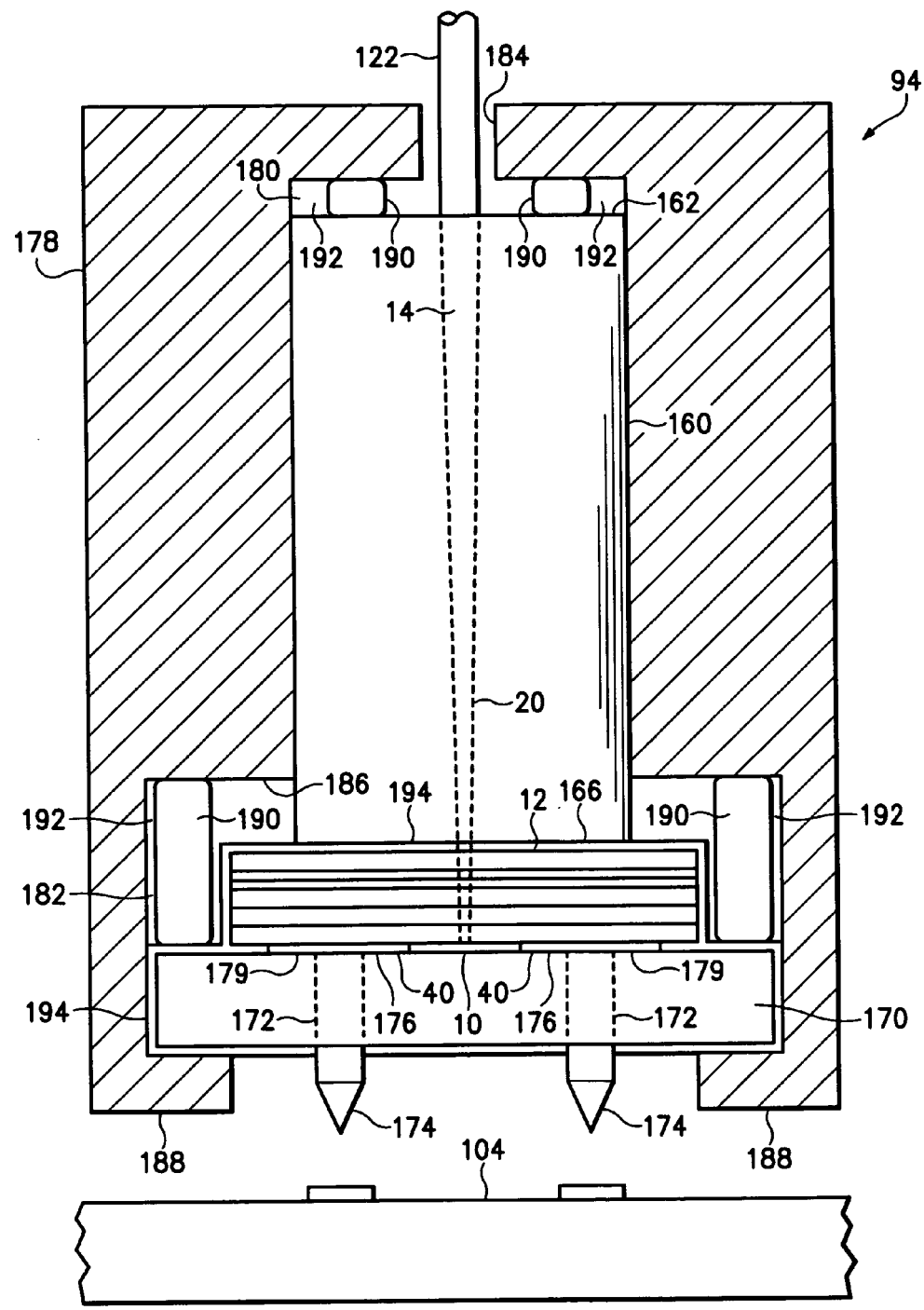
FIG. 7 illustrates a partially sectioned view of the probing components within the probing head in the signal acquisition probing system according to the present invention.

FIG. 7 is a partially sectioned view illustrating the probing components within the probing head 94. The probing components include a collimating lens 160 having a top flat surface 162 which receives the optical fiber 122 from the signal acquisition control circuitry 110. The micro-cavity laser 12 is secured to the opposing bottom surface 166 of the collimating lens using a non-conductive adhesive, such as epoxy or the like. The preferred structure of the micro-cavity laser 12 is essentially the same as previously described. The micro-cavity laser 12 has the electrode structure 10 with electrically conductive contacts 40 formed on the bottom exterior surface of the micro-cavity laser 12. The reflective coating 20, 22 and 28 that form parts of the micro-cavity laser 12 are formed of the previously described non-conductive materials. It is important in probing applications to minimize conductive materials near the micro-cavity laser 12 to limit inductive and capacitive interference in the operation of the micro-cavity laser. The micro-cavity laser 12 has a preferred length along the optical Z-axis of 1 mm, a width along the optical Y-axis of 1 mm and a thickness along the optical X-axis of approximately 20 microns. The optics in the collimating lens 160 produces a collimated beam 14 from the optical fiber 122 that is focused along an optical path 20 substantially parallel to the electrode structure 10 in the micro-cavity laser 12. The frequency modulated optical signal generated within the micro-cavity laser 12 exits through the reflective coating 20 and passes through the collimating lens 160 along the optical path 20 which focuses the frequency modulated optical signal on the optical fiber 122.

Disposed adjacent to the bottom surface of the micro-cavity laser 12 is a probe contact substrate 170 for supporting probing contacts, such as contact pads and probing tips. The probe contact substrate 170 is preferably formed of a non-conductive material, such as alumina, circuit board material or the like. In one embodiment, the probe contact substrate 170 has apertures 172 formed therein for receiving electrically conductive probing tips 174. The electrically conductive probing tips 174 are electrically coupled to the electrically conductive contacts 40 on the micro-cavity laser 12. The electrically conductive probing tips 174 may directly contact the electrically conductive contacts 40 but it is preferable that electrically conductive contacts 176 be formed on the upper surface of the probe contact substrate 170 that are electrically coupled to the probing tips 174. The electrically conductive contacts 176 on the probe contact substrate 170 electrically contact the electrically conductive contacts 40 on the micro-cavity laser 12. A conductive adhesive, such as epoxy or the like, is applied to the contacts 40 and 176 for securing the probe contact substrate 170 to the micro-cavity laser 12. Alternately, flexible type electrical contacts be disposed between the probing pins 174 and the contacts 40. The flexible type contacts may take the form of electrically conductive elastomers, flexible C-type string contacts, or the like. A mechanical registration element would attach the probe contact substrate 170 to the micro-cavity laser 12. In a further embodiment, the apertures 172 and probing tips 174 may be replaced with protrusions extending from the bottom of the probe contact substrate 170 forming the probing contacts. Electrically conductive material, such as gold plated over a layer of chromium, is disposed on the bottom surfaces of the protrusions. Electrically conductive vias are formed in the probe contact substrate 170 to electrically couple the electrically conductive contacts on the protrusions to the top surface of the substrate 170.

Optical cavities used as voltage sensing devices, such as the micro-cavity laser 12, are high impedance devices. In certain probing applications it may be preferable to match the impedance at the probe to the impedance of the device under test 104. As previously described in relation to FIGS. 3A and 3B, the optional termination resistor 50 may be connected between the electrically conductive electrodes 30 and 32 of the electrode structure 10 or between the electrically conductive contacts 40 on the exterior surface 42 of the micro-cavity laser 12. The resistance of the termination resistor 44 is set to match the impedance of the device under test 104. This allows differential measurements to be made in a defined impedance environment, such as 50 ohms. Terminating the sensing device in the impedance of the device under test improves signal fidelity by reducing the reflections that would be caused by impedance mismatches between the device under test and the sensing device. The resistance of the termination resistor 44 may be set to various values to conform to specific device under test impedance environments. In addition, damping resistors 179 may be formed on the exterior surface of the micro-cavity laser 12 and coupled in series with each of the electrically conductive electrodes of the electrode structure 10. The damping resistors 179 may also be formed on the probe contact substrate 170 in series with the electrically conductive contacts 176 be formed on the upper surface of the probe contact substrate 170.

The collimating lens 160, the micro-cavity laser 12 and the probing contact substrate 170 are disposed within a non-conductive housing 178, formed from ABS plastic, poly-carbonate, poly-carbonate ABS, poly-phenylene sulfide or the like. The housing has a first cavity 180 for receiving the collimating lens 160 and a second cavity 182 for receiving the micro-cavity laser 12 and the probe contact substrate 170. The housing has an opening 184 extending from the top surface of the housing to the first cavity 180 to allow the optical fiber 122 to be connected to the collimating lens 160. The interface between the first and second cavities 180 and 182 defines a shoulder 186. A rib 188 is formed at the bottom of the housing 178 that protrudes into the second cavity 182 for supporting the probe contact substrate 170, the micro-cavity laser 12 and the collimating lens 160. The first and second cavities 180 and 182 are sized to closely conform to the lateral dimensions of the collimating lens 160 and the probe contact substrate 170. Both cavities 180 and 182 are sized to provide excess vertical clearance for the collimating lens 160 and the probe contact substrate 170 so as to provide axial movement of the probing elements within the housing 178. A spring mechanism 190, in the form of elastomeric material, mechanical springs or the like, is provided in the gaps 192 between the housing 178 and the collimating lens 160 and the probe contact substrate 170. The housing 178 is disposed within a probing head shell that provides strain relief for the optical fiber 122 and protection and support for the elements within the housing 178.

Acoustic modes are generated in electro-optic material 26 as a result of piezoelectric effects of electromagnetic signals on electrodes connected to the electro-optic material 26. The piezoelectric effect changes the physical dimensions of the electro-optic material 26 resulting in acoustic distortion that causes optical noise to be imparted in an optical signal generated by the electro-optic material 26. In an optical cavity, such as the micro-cavity laser 12, the changes in the physical dimensions of the optical cavity causes variances in the resonance points of the cavity. This results in acoustic distortion that is imparted as optical noise in the modulated optical return signal generated by the micro-cavity laser 12. An acoustic damping material 194 may be applied to the micro-cavity laser 12 and/or the probe contact substrate 170 to minimize the acoustic modes in the micro-cavity laser 12. The acoustic damping material 194 is made of an adhesive material, such as epoxy, ultraviolet cured (UV) epoxy, urethane, silicone or the like doped with a ceramic crystalline material, such as yttrium-aluminum-garnet or the like. The acoustic impedance of the adhesive material is generally substantially less than the acoustic impedance of the electro-optic material 26 in the micro-cavity laser 12 whereas the acoustic impedance of the ceramic crystalline material is substantially higher than the electro-optic material 26. The blend of the adhesive material and the ceramic crystalline material is formulated to match the acoustic impedance of the electro-optic material 26 in the optical cavity. For the micro-cavity laser 12 having RTA electro-optic material, the acoustic damping material 194 using epoxy as an adhesive has between 25% and 50% by volume of yttrium-aluminum-garnet ceramic crystalline material with the preferred volume being 50%. The use of other types of adhesive material and other types of ceramic crystalline material will alter the volume percentage of the ceramic crystalline material. Further, the use of other types of electro-optic material 26 having different acoustic impedances requires different percentages or types of ceramic crystalline material. In addition, an optical absorbing material, such as carbon black, may be added to the acoustic damping material 194 to absorb optical radiation escaping the optical cavity and to prevent extraneous optical radiation from entering the optical cavity.

The acoustic damping material 194 may be applied to substantially all of the surfaces of the micro-cavity laser 12 leaving gaps for the optical signals leaving and entering the collimating lens 160 and for the electrical connections between the electrically conductive contacts 40 on the micro-cavity laser 12 and the electrically conductive contacts 176 on the probe contact substrate 170. In the preferred implementation, the acoustic damping material 194 is applied to substantially all of the outer exposed surfaces of the micro-cavity laser 12 and the probe contact substrate 170. A gap is provided on the top surface of the micro-cavity laser 12 for the optical signals leaving and entering the collimating lens 160 and the probing contacts 174 extending from the bottom of the probe contact substrate 170 are left exposed.

The probe interconnect housing 98 is plugged into one of the interconnect receptacles 100 in the measurement instrument 92. Parameters may be set for the signal acquisition probing system 90, such as gain or attenuations levels of the optical receiver or the like, using controls on the measurement instrument 92 or via commands sent to the measurement instrument 92 via an external communications bus. The optical transmitter 112 in the signal acquisition probing circuitry 110 generates an optical output that is coupled via the optical fiber 122 in the optical transmission system 96 to the bulk optic collimating lens 160. The collimating lens 160 focuses the optical signal on the micro-cavity laser 12. The user contacts the probing head 94 to a selected test node on the device under test 104 to acquire a signal to be measured. The measured signal may be a differential signal or a single signal. The measured signal is coupled through the probing contacts or pins 174 of the probe contact substrate 170 to the electrode structure 10 in the micro-cavity laser 12. The electrical signal on the electrode structure 10 varies the index of refraction of the electro-optic material in the micro-cavity laser 12 as a function of the magnitude changes in the electric signal. The changing index of refraction in the electro-optic material causes corresponding changes in the wavelength of the laser signal 23 micro-cavity laser 12. The frequency modulated optical signal passes out of the micro-cavity laser 12 into the collimating lens 160 which focuses the frequency modulated optical signal onto the end of the optical fiber 122. The optical fiber 122 couples the frequency modulated optical signal to the beam splitter 118. The beam splitter 118 coupled the frequency modulated optical signal to the Fabry-Perot etalon 132 in the optical receiver 114 of the signal acquisition probing circuitry 110. The Fabry-Perot etalon 132 converts the frequency modulated optical signal into a intensity modulated optical signal that is coupled to the O/E converter 134. The O/E converter converts the intensity modulated optical signal into an electrical signal representative of signal being measured on the device under test 104. The electrical output from the O/E converter 134 is amplified in the amplifier circuitry 136 and coupled to the measurement instrument 92 via the high speed coaxial interconnect 126. A portion of the intensity modulated optical signal from the Fabry-Perot etalon 132 is reflected back into the beam splitter and coupled to O/E slow detector 138. The O/E slow detector 138 converts the intensity modulated optical signal to an electrical signal, which is input to the comparator 140. The electrical output of the O/E converter 134 is also coupled to a signal averager 142, which generates an electrical output representative of the average output of the O/E converter 134. The average output signal is coupled to the other input of the comparator which generates an output for tuning the Fabry-Perot etalon 132.

Figure 8:
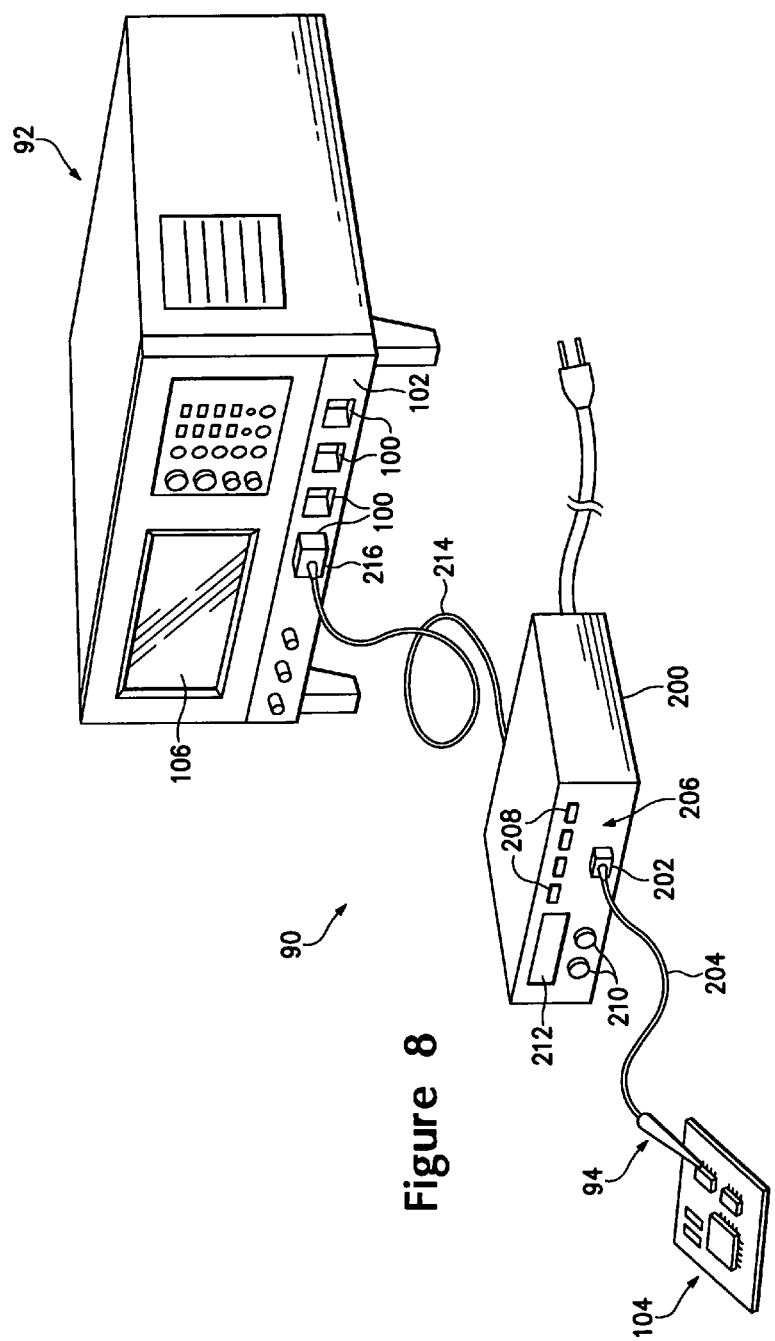
FIG. 8 illustrates a further embodiment of the signal acquisition probing system according to the present invention.

FIG. 8 illustrates a further embodiment of the signal acquisition probing system 90 for probing electrical signal on a device under test 104. The probe interconnect housing 98 is replaced with an independently powered probe controller 200 and an interconnect adapter 216. The probe controller 200 contains the optical transmitter 112 that provides the optical signal to the probe head 94 and the optical receiver 114 that converts the returning frequency modulated optical signal to an electrical signal. The probe controller 200 also includes associated processing circuitry, such as a micro-controller, memory, ASICs and the like, and a power supply for generating the necessary voltages for operating the circuitry within the controller 200. The probe controller 200 includes at least a first optical connector 202 for coupling optical signals to and from the probing head 94. The probe controller 200 may include front panel controls 206, such as switches 208, knobs 210 and a display 212 to allow for operator inputs to the controller 200. A electrical output connector is provided for coupling a wide bandwidth coaxial cable 214 having wide bandwidth connectors, such as SMA connectors, from the probe controller 200 to the measurement instrument 92. The interconnect adapter 216, such as described in U.S. Pat. No. 6,402,549 and incorporated herein in its entirety by reference, includes a corresponding wide bandwidth connector. The interconnect adapter 216 may be modified to include signal lines for allowing communications between the measurement instrument 92 and the probe controller 200.

A signal acquisition probing system has been described where micro-cavity laser is used to acquire an electrical signal from a device under test. The micro-cavity laser has a VCSEL gain medium and an electro-optic optical resonant cavity. The micro-cavity laser is pumped by an external laser source and generates a frequency modulated optical signal derived from the device under test electrical signal creating an electro-magnetic field distribution in electro-optic material in the micro-cavity laser that overlaps the optical path of the optical signal propagating in the electro-optic material. The electro-magnetic field varies the index of refraction of the electro-optic material in the optical path. The frequency modulated optical signal is coupled to an optical receiver via the optical transmission system which converts the frequency modulated optical signal to an electrical signal. The electrical signal is coupled to measurement test instrument for processing and displaying of the electrical signal. The signal acquisition probing system included control circuitry for controlling the optical power level and wavelength of the optical signal from the optical transmitter and the gain of the output electrical signal from the optical receiver.

It will be obvious to those having skill in the art that many changes may be made to the details of the above-described embodiments of this invention without departing from the underlying principles thereof. The scope of the present invention should, therefore, be determined only by the following claims.

What is claimed is:

1. A signal acquisition probing system using electro-optic detection for sensing an electrical signal from a device under test comprising:
    an optical transmitter generating a coherent optical signal;
    a micro-cavity having an optical gain cavity formed by a vertical cavity surface emitting laser having an optical gain medium disposed between opposing optically reflective materials that receives the optical signal from the optical transmitter and generates an optical output, and an optical resonant cavity having electro-optic material disposed between opposing optically reflective materials with one of the optically reflective materials being a common reflective material with one of the optical reflective materials of the optical gain cavity that receives the optical output from the optical gain cavity;
    first and second electrically conductive electrodes receiving the electrical signal from the device under test with each of the first and second electrically conductive electrodes being formed in at least a portion of the electro-optic material generally parallel to the received optical signal propagating within the electro-optic material;
    an optical transmission system optically coupled to the optical transmitter, micro-cavity laser and an optical receiver providing the optical signal from the optical transmitter to the micro-cavity laser and providing a frequency modulated optical signal to the optical receiver representing the electrical signal from the device under test derived from the device under test electrical signal creating an electromagnetic field distribution in the electro-optic material that overlaps the optical path of the optical signal propagating in the electro-optic material and varies the index of refraction of the electro-optic material in the optical path; and
    the optical receiver generating an output electrical signal from the frequency modulated optical signal from the micro-cavity laser.

2. The signal acquisition probing system as recited in claim 1 further comprising a resistor coupled between the first and second electrically conductive electrodes.

3. The signal acquisition probing system as recited in claim 1 further comprising a resistor coupled to each of the first and second electrically conductive electrodes.

4. The signal acquisition probing system as recited in claim 1 wherein the micro-cavity laser further comprises electrically conductive contacts formed on an exterior surface of the micro-cavity laser with the one of the electrically conductive contacts electrically coupled to the first electrically conductive electrode and the other electrically conductive contact electrically coupled to the second electrically conductive electrode.

5. The signal acquisition probing system as recited in claim 4 further comprising a resistor coupled between the electrically conductive contacts.

6. The signal acquisition probing system as recited in claim 4 further comprising a resistor coupled to each of the electrically conductive contacts.

7. The signal acquisition probing system as recited in claim 1 wherein the optical signal from the optical gain cavity propagates generally parallel to at least a first optical axis in the electro-optic material with the first and second electrically conductive electrodes generally parallel to same optical axis.

8. The signal acquisition probing system as recited in claim 1 wherein the electro-optic material has X, Y, and Z optical axes and corresponding crystal faces orthogonal to the respective X, Y, and Z optical axes with the optical resonant cavity further comprising the opposing optically reflective materials being disposed on the Y-crystal face and the first and second electrically conductive electrodes being orthogonal to the Y-crystal face of the electro-optic material.

9. The signal acquisition probing system as recited in claim 1 wherein the electro-optic material has X, Y, and Z optical axes and corresponding crystal faces orthogonal to the respective X, Y, and Z optical axes with the optical resonant cavity further comprising the opposing optically reflective materials being disposed on the X-crystal face and the first and second electrically conductive electrodes being orthogonal to the X-crystal face of the electro-optic material.

10. The signal acquisition probing system as recited in claim 1 wherein the electro-optic material has X, Y, and Z optical axes and corresponding crystal faces orthogonal to the respective X, Y, and Z optical axes with the optical resonant cavity further comprising the opposing optically reflective materials being disposed on the Z-crystal face and the first and second electrically conductive electrodes being orthogonal to the Z-crystal face of the electro-optic material.

11. The signal acquisition probing system as recited in claim 1 wherein the optical transmission system further comprises an optical bean splitter coupled to receive the optical signal from the optical transmitter and the frequency modulated optical signal from the micro-cavity laser, first and second collimating lenses with the first collimating lens optically coupled to the optical beam splitter and the second collimating lens optically coupled to the micro-cavity laser and a multimode optical fiber coupled between the first and second collimating lenses.

12. The signal acquisition probing system as recited in claim 11 wherein the optical receiver further comprises:
    a Fabry-Perot etalon optically coupled to receive the frequency modulated optical signal from the micro-cavity laser via the optical beam splitter of the optical transmission system and generating a intensity modulated optical signal representative of the electrical signal from the device under test;
    a first optical-to-electrical converter coupled to receive the intensity modulated optical signal and generating an electrical signal representative of the electrical signal under test;

an amplifier coupled to receive a portion of the electrical signal from the first optical-to-electrical converter and generating an amplified electrical signal representative of the electrical signal from the device under test;

a second optical-to-electrical converter coupled to the beam-splitter receiving a reflected intensity modulated optical signal from the Fabry-Perot etalon and generating an electrical signal;

a signal averager coupled to receive the other portion of the electrical signal from the first optical-to-electrical converter and generating an electrical signal representative of the average output of the optical-to-electrical converter; and a comparator receiving the electrical signal from the signal averager and the electrical signal from the second optical-to-electrical converter and generating an electrical signal for tuning the Fabry-Perot etalon to lock the Fabry-Perot etalon passband to the average value of the micro-cavity laser frequency.

13. The signal acquisition probing system as recited in claim 1 further comprising an acoustic damping material substantially covering the micro-cavity laser to minimize acoustic modes in the micro-cavity laser.

* * * * *

UNITED STATES PATENT AND TRADEMARK OFFICE
CERTIFICATE OF CORRECTION

PATENT NO. : 7,187,187 B2 Page 1 of 1
APPLICATION NO. : 11/077692
DATED : March 6, 2007
INVENTOR(S) : Christopher P. Yakymyshyn et al.

It is certified that error appears in the above-identified patent and that said Letters Patent is hereby corrected as shown below:

Col. 16, claim 11, line 48, "bean splitter" should read --beam splitter.--

Signed and Sealed this

Third Day of July, 2007

JON W. DUDAS
*Director of the United States Patent and Trademark Office*